(12) United States Patent
Yim et al.

(10) Patent No.: US 9,324,571 B2
(45) Date of Patent: Apr. 26, 2016

(54) POST TREATMENT FOR DIELECTRIC CONSTANT REDUCTION WITH PORE GENERATION ON LOW K DIELECTRIC FILMS

(71) Applicant: Applied Materials, Inc., Santa Clara, CA (US)

(72) Inventors: Kang Sub Yim, Palo Alto, CA (US); Pendar Ardalan, Palo Alto, CA (US); Sure Ngo, Dublin, CA (US); Alexandros T. Demos, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/765,673

(22) PCT Filed: Feb. 4, 2014

(86) PCT No.: PCT/US2014/014678
§ 371 (c)(1),
(2) Date: Aug. 4, 2015

(87) PCT Pub. No.: WO2014/158351
PCT Pub. Date: Oct. 2, 2014

(65) Prior Publication Data
US 2015/0380265 A1 Dec. 31, 2015

Related U.S. Application Data

(60) Provisional application No. 61/779,993, filed on Mar. 13, 2013.

(51) Int. Cl.
*H01L 21/00* (2006.01)
*H01L 21/3105* (2006.01)
*H01L 21/02* (2006.01)

(52) U.S. Cl.
CPC ...... *H01L 21/31058* (2013.01); *H01L 21/0234* (2013.01); *H01L 21/02126* (2013.01);
(Continued)

(58) Field of Classification Search
CPC .................. H01L 21/31058; H01L 21/02126; H01L 21/02211; H01L 21/02214; H01L 21/02359; H01L 21/02274; H01L 21/02348; H01L 21/02351; H01L 21/02203; H01L 21/0234
See application file for complete search history.

(56) References Cited

U.S. PATENT DOCUMENTS

| 8,357,728 | B2 * | 1/2013 | Butler et al. | 521/64 |
| 2004/0175957 | A1 | 9/2004 | Lukas et al. | |
| 2007/0227907 | A1 * | 10/2007 | Shah et al. | 205/777.5 |
| 2008/0038934 | A1 | 2/2008 | Vrtis et al. | |

(Continued)

FOREIGN PATENT DOCUMENTS

KR 1020090006769 A 1/2009

OTHER PUBLICATIONS

International Search Report and Written Opinion, PCT/US2014/014678, Oct. 2, 2014.

*Primary Examiner* — Richard Booth
(74) *Attorney, Agent, or Firm* — Patterson & Sheridan, LLP

(57) ABSTRACT

A method and apparatus for depositing a low K dielectric film with one or more features is disclosed herein. A method of forming a dielectric layer can include positioning a substrate in a processing chamber, delivering a deposition gas to the processing chamber, depositing a dense organosilicon layer using the deposition gas on the surface of the substrate, the dense organosilicon layer comprising a porogenic carbon, transferring a pattern into the dense organosilicon layer, forming a pore-forming plasma from a reactant gas, exposing the dense organosilicon layer to the pore-forming plasma to create a porous organosilicon layer, wherein the pore-forming plasma removes at least a portion of the porogenic carbon and exposing the porous organosilicon layer to a desiccating post treatment.

20 Claims, 3 Drawing Sheets

(52) U.S. Cl.
CPC .... *H01L21/02203* (2013.01); *H01L 21/02211* (2013.01); *H01L 21/02214* (2013.01); *H01L 21/02274* (2013.01); *H01L 21/02348* (2013.01); *H01L 21/02351* (2013.01); *H01L 21/02359* (2013.01)

(56) References Cited

U.S. PATENT DOCUMENTS

2012/0156890 A1 6/2012 Yim et al.
2012/0178253 A1 7/2012 Ahn et al.

* cited by examiner

POST TREATMENT FOR DIELECTRIC CONSTANT REDUCTION WITH PORE GENERATION ON LOW K DIELECTRIC FILMS

BACKGROUND OF THE INVENTION

1. Field of the Invention

Embodiments disclosed herein generally relate to films having a low dielectric constant for use in the fabrication of electronic and semiconductor devices.

2. Description of the Related Art

As the semiconductor industry introduces new generations of integrated circuits (ICs) having higher performance and greater functionality, the density of the elements that form those ICs is increased, while the dimensions, size and spacing between the individual components or elements are reduced. While in the past such reductions were limited only by the ability to define the structures photolithographically, device geometries having dimensions measured in um or nm have created new limiting factors, such as the conductivity of the metallic elements or the dielectric constant of the insulating material(s) used between the elements.

In the field of advanced semiconductor fabrication, dielectrics with low K values are required for future generations of integrated circuits having design rules of less than or equal to 90 nanometers (nm) so as to reduce overall capacitance crosstalk. The term "low K dielectric" generally refers to materials having a dielectric constant that is generally less than about 3.9. More typically, for the advanced design rules, the dielectric constants of the low K dielectric materials are selected to be less than 3.0, and oftentimes less than 2.5. The dielectric films are generally deposited or formed using a spin-on process or by using a chemical vapor deposition (CVD) process.

To achieve the low K values which can be required by modern semiconductor devices, porous layers have been used to incorporate air (which has a K value of 1). Several methods have been pursued to induce porosity into low dielectric materials, such as organic, low K polymers or organic polysilica, low K polymers. One approach is to fabricate a hybrid organic-inorganic film using a mixture of silicon and organic precursors, with the film being subsequently cured using heat, electron beam (e-beam) or ultraviolet radiation (UV) to degrade the organic molecules. By degrading the organic molecules, pores are created but the mechanical strength of the layer is diminished.

Further problems arise with relation to the formation of features in the low K film. In conventional schemes, the deposited film is generally cured using either a thermal process, a UV process, an electron beam (e-beam) process or others to produce a porous film. The porous film is then undergoes etching, ashing, wet clean or other processes related to the formation of features. However, these processes can easily damage the porous low K film.

Therefore, there is a need for methods of preventing damage in ultra low K dielectric films during the fabrication of IC devices.

SUMMARY OF THE INVENTION

Embodiments disclosed herein generally relate to methods of forming low K dielectric films to prevent integration damage. By forming the low K dielectric layer with the porogenic carbon and forming the one or more features therein prior to pore formation or curing the layer using a shrinkage minimizing cure, we are able to generate a dielectric layer with a low K value while preventing the damage related to integration steps, such as damage which can occur during etching and ashing.

In one embodiment, a method of forming a dielectric layer can include positioning a substrate in a processing chamber, delivering a deposition gas to the processing chamber, depositing a dense organosilicon layer using the deposition gas on the surface of the substrate, the dense organosilicon layer comprising a porogenic carbon, transferring a pattern into the dense organosilicon layer, forming a pore-forming plasma from a reactant gas, exposing the dense organosilicon layer to the pore-forming plasma to create a porous organosilicon layer, wherein the pore-forming plasma removes at least a portion of the porogenic carbon and exposing the porous organosilicon layer to a desiccating post treatment.

In another embodiment, a method of forming a dielectric layer can include activating a deposition gas in the presence of a substrate to deposit an organosilicon layer on a surface of the substrate, the organosilicon layer comprising a porogenic carbon; transferring a pattern into the organosilicon layer; removing the porogenic carbon from the organosilicon layer to create a porous organosilicon layer; and exposing the porous organosilicon layer to a desiccating post treatment.

In another embodiment, a method of forming a dielectric layer can include positioning a substrate in a processing chamber; activating a deposition gas in the presence of a substrate to deposit an organosilicon layer on a surface of the substrate, the organosilicon layer comprising silicon, oxygen, carbon, hydrogen and a porogenic carbon; transferring a pattern into the organosilicon layer; forming a pore-forming plasma from a reactant gas, the pore forming plasma comprising an oxidative gas; exposing the organosilicon layer to the pore-forming plasma to create a porous organosilicon layer; and exposing the porous organosilicon layer to a desiccating post treatment, the desiccating post treatment selected from UV treatment, thermal treatment or e-beam treatment.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments disclosed herein generally relate to method for forming an ultra low dielectric film. More specifically, embodiments disclosed herein generally relate to methods of generating an ultra low K film while preventing damage to the deposited layer. In the embodiments described herein, an organosilicon layer with a porogenic carbon is deposited on a substrate. The organosilicon layer is then integrated by forming one or more features in the organosilicon layer. The layer is then treated with an oxidative or reductive gas to remove carbon from the layer. After the carbon has been removed, the organosilicon layer is then desiccated in a post-treatment, thus creating a low K layer which has one or more features formed therein while avoiding related damage. The invention disclosed herein is more clearly described with reference to the figures below.

Figure 1:
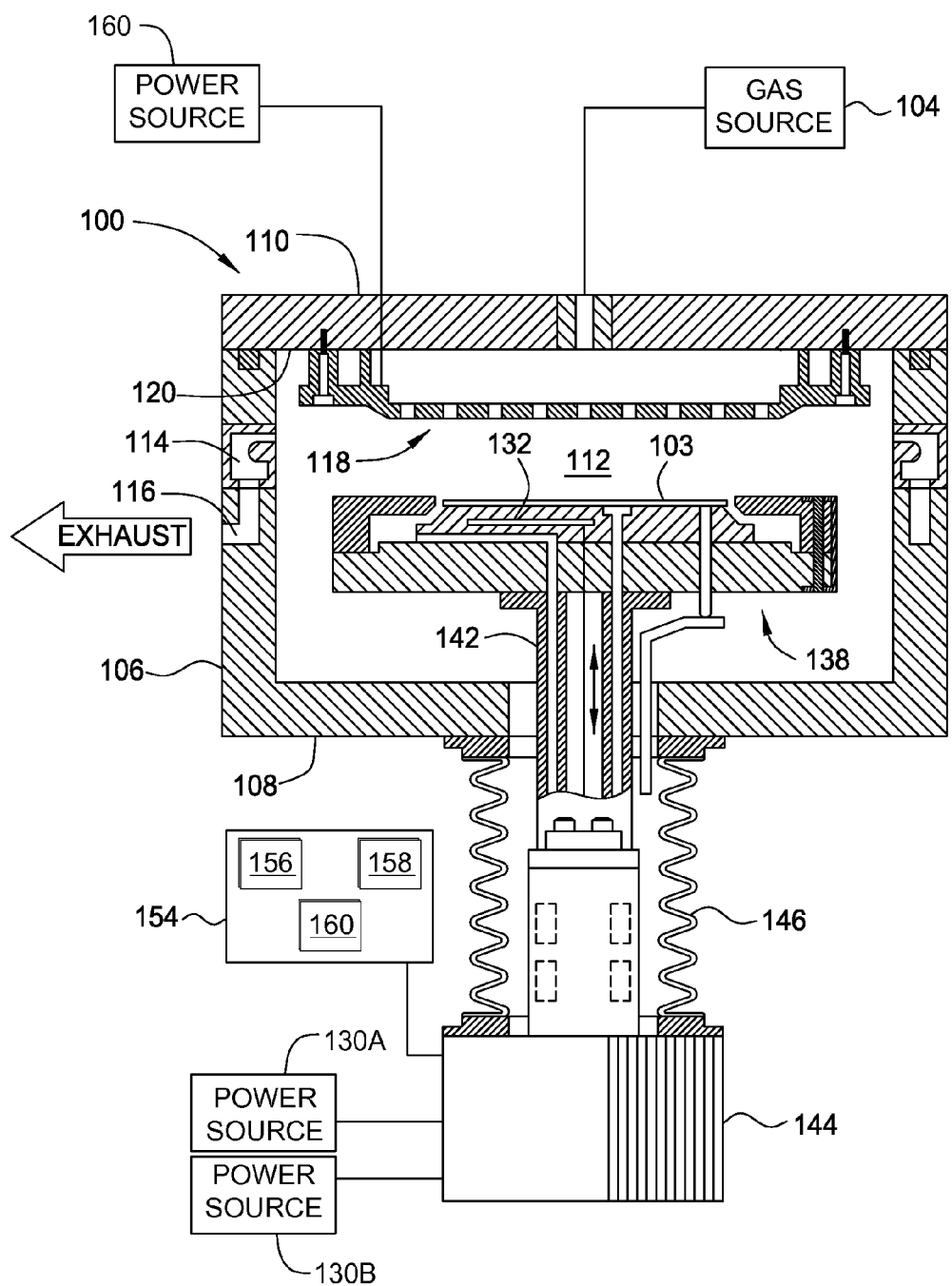
FIG. 1 is a schematic cross-sectional view of a processing chamber configured according to one or more embodiments.

FIG. 1 is a schematic cross-sectional view of a CVD processing chamber 100 that may be used for depositing a carbon based layer according to the embodiments described herein. A processing chamber 100 is available from Applied Materials, Inc. located in Santa Clara, Calif., and a brief description thereof follows. Processing chambers that may be adapted to perform the carbon layer deposition methods described herein is the PRODUCER® chemical vapor deposition chamber, both available from Applied Materials, Inc. located in Santa Clara, Calif. It is to be understood that the chamber described below is an exemplary embodiment and other chambers, including chambers from the same or other manufacturers, may be used with or modified to match embodiments of this invention without diverging from the inventive characteristics described herein.

The processing chamber 100 may be part of a processing system (not shown) that includes multiple processing chambers connected to a central transfer chamber (not shown) and serviced by a robot (not shown). The processing chamber 100 includes walls 106, a bottom 108, and a lid 110 that define a process volume 112. The walls 106 and bottom 108 can be fabricated from a unitary block of aluminum. The processing chamber 100 may also include a pumping ring 114 that fluidly couples the process volume 112 to an exhaust port 116 as well as other pumping components (not shown).

A substrate support assembly 138, which may be heated, may be centrally disposed within the processing chamber 100. The substrate support assembly 138 supports a substrate 103 during a deposition process. The substrate support assembly 138 generally is fabricated from aluminum, ceramic or a combination of aluminum and ceramic, and includes at least one bias electrode 132.

A vacuum port may be used to apply a vacuum between the substrate 103 and the substrate support assembly 138 to secure the substrate 103 to the substrate support assembly 138 during the deposition process. The bias electrode 132, may be, for example, the electrode 132 disposed in the substrate support assembly 138, and coupled to a bias power source 130A and 130B, to bias the substrate support assembly 138 and substrate 103 positioned thereon to a predetermined bias power level while processing.

The bias power source 130A and 130B can be independently configured to deliver power to the substrate 103 and the substrate support assembly 138 at a variety of frequencies, such as a frequency between about 1 and about 60 MHz. Various permutations of the frequencies described here can be employed without diverging from the invention described herein.

Generally, the substrate support assembly 138 is coupled to a stem 142. The stem 142 provides a conduit for electrical leads, vacuum and gas supply lines between the substrate support assembly 138 and other components of the processing chamber 100. Additionally, the stem 142 couples the substrate support assembly 138 to a lift system 144 that moves the substrate support assembly 138 between an elevated position (as shown in FIG. 1) and a lowered position (not shown) to facilitate robotic transfer. Bellows 146 provide a vacuum seal between the process volume 112 and the atmosphere outside the chamber 100 while facilitating the movement of the substrate support assembly 138.

The showerhead 118 may generally be coupled to an interior side 120 of the lid 110. Gases (i.e., process and other gases) that enter the processing chamber 100 pass through the showerhead 118 and into the processing chamber 100. The showerhead 118 may be configured to provide a uniform flow of gases to the processing chamber 100. Uniform gas flow is desirable to promote uniform layer formation on the substrate 103. A plasma power source 160 may be coupled to the showerhead 118 to energize the gases through the showerhead 118 towards substrate 103 disposed on the substrate support assembly 138. The plasma power source 160 may provide RF power. Further, the plasma power source 160 can be configured to deliver power to the showerhead 118 at a at a variety of frequencies, such as a frequency between about 100 MHz and about 200 MHz. In one embodiment, the plasma power source 160 is configured to deliver power to the showerhead 118 at a frequency of 162 MHz.

The function of the processing chamber 100 can be controlled by a computing device 154. The computing device 154 may be one of any form of general purpose computer that can be used in an industrial setting for controlling various chambers and sub-processors. The computing device 154 includes a computer processor 156. The computing device 154 includes memory 158. The memory 158 may include any suitable memory, such as random access memory, read only memory, flash memory, hard disk, or any other form of digital storage, local or remote. The computing device 154 may include various support circuits 160, which may be coupled to the computer processor 156 for supporting the computer processor 156 in a conventional manner. Software routines, as required, may be stored in the memory 156 or executed by a second computing device (not shown) that is remotely located.

The computing device 154 may further include one or more computer readable media (not shown). Computer readable media generally includes any device, located either locally or remotely, which is capable of storing information that is retrievable by a computing device. Examples of computer readable media 154 useable with embodiments of the present invention include solid state memory, floppy disks, internal or external hard drives, and optical memory (CDs, DVDs, BR-D, etc). In one embodiment, the memory 158 may be the computer readable media. Software routines may be stored on the computer readable media to be executed by the computing device.

The software routines, when executed, transform the general purpose computer into a specific process computer that controls the chamber operation so that a chamber process is performed. Alternatively, the software routines may be performed in hardware as an application specific integrated circuit or other type of hardware implementation, or a combination of software and hardware.

Figure 2A:
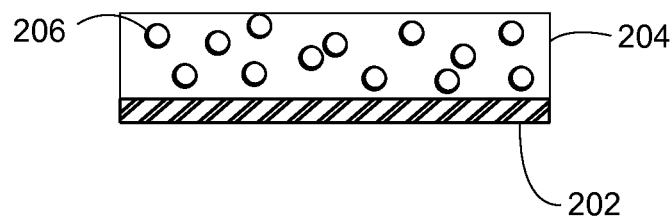
FIGS. 2A-2C depict a porous organosilicon layer formed according to one or more embodiments.
Figure 2B:
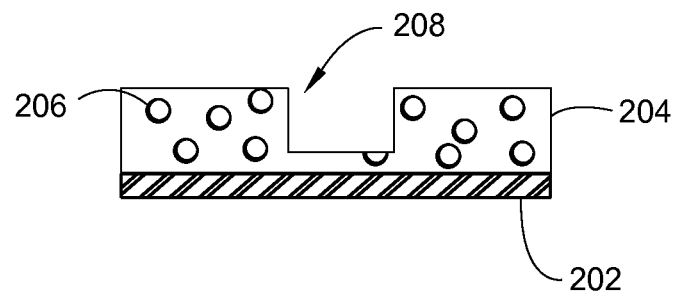
Figure 2C:
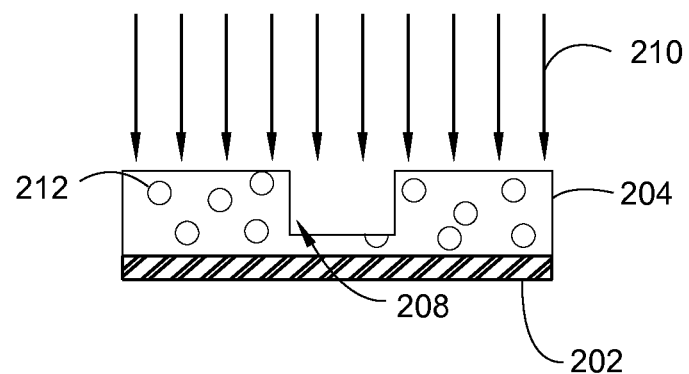

FIGS. 2A-2C depict a porous organosilicon layer formed according to one or more embodiments. The size, positioning and shape of components shown in FIGS. 2A-2C are not to scale and are shown for exemplary purposes only.

FIG. 2A depicts a substrate 202 with an organosilicon layer 204 formed thereon. The substrate 202 can be, among others, a thin sheet of metal, plastic, organic material, silicon, glass, quartz, or polymer materials. In one embodiment, the substrate 202 is a glass substrate upon which a silicon-containing layer will be deposited. In other embodiments, the substrate 202 may be a doped or otherwise modified glass substrate.

The organosilicon layer 204 can comprise silicon, oxygen, carbon and hydrogen, and can have the general formula, $Si_aO_bC_cH_d$, (in which the atomic % of a+b+c+d=100%; a=10-35%, b=1-66%, c=1-35%, d=0-60%). In one embodiment, the organosilicon layer can further comprise fluorine. The organosilicon layer 204 is generally deposited by CVD, such as PE-CVD, however the deposition technique used to deposit the organosilicon layer 204 is not intended to be limiting. The ratio and structural arrangement of carbon, silicon, oxygen, fluorine, and hydrogen atoms in the final organosilicon layer 204 is dependent on the precursors chosen, the oxidant, and the CVD process conditions, such as RF power, gas flow, residence time, and temperature. The organosilicon layer 204 can be deposited using a deposition gas comprising one or more precursors. The precursors can comprise silicon and carbon.

A porogenic carbon 206 is incorporated into the organosilicon layer 204. In this depiction, the porogenic carbon 206 is shown as embedded randomly in the organosilicon layer 204, however this arrangement is not intended to be limiting. The porogenic carbon 206 shown here is for explanation purposes only and may be a discrete component of the organosilicon layer 204 or may be a portion of a molecule which comprises the organosilicon layer 204. Porogenic carbons can include a member selected from the group consisting of cyclooctene, cycloheptene, cyclooctane, cycloheptane, cyclohexene, cyclohexane, and bicycle chemicals and mixtures thereof.

FIG. 2B depicts the organosilicon layer 204 with a feature 208 formed therein, according to one or more embodiments. The feature 208 can be one of a variety of known features in the art, such as channels or vias. The feature 208 can be formed by one or more known methods such as by using a photoresist (not shown) and a hardmask (not shown) with subsequent etching. The feature 208 and be of a variety of widths and heights as restricted by the needs of the user, the thickness of the organosilicon layer 204 and possible underlying layers (not shown). Though the feature 208 is shown as a square shape, the shape of the feature 208 shown is not limiting. As shown herein, the feature 208 is formed in the organosilicon layer 208 with the porogenic carbons 206 still present.

Without intending to be bound by theory, the pores formed by removal of the porogenic carbons are believed to reduce the structural integrity and increase the surface area of the organosilicon layer 208. Pores formed at or near the surface can increase the surface area. As the presence of plasma or etchants creates various radicals and ions, increased surface area increases damage caused during surface contact. However, by maintaining the porogenic carbon 206 in the organosilicon layer 208 during the formation of one or more features 208, the organosilicon layer 208 is more capable of withstanding the processing steps related to feature formation.

FIG. 2C depicts a pore-forming plasma 210 being delivered to the organosilicon layer 204 formed over the substrate 202. The pore-forming plasma 210 can include an oxidizing gas or a reducing gas. The pore-forming plasma 210 reacts with the porogenic carbon 206 to abstract at least a portion of the porogenic carbon 206 from the organosilicon layer 204 leaving behind a plurality of pores 212. The plurality of pores 212 are not depicted to scale and are based on the size and positioning of the porogenic carbon 206 which is displaced by the pore-forming plasma 210. Once the pore-forming plasma 210 is received, the substrate 202 can be treated with one or more desiccating post treatments, described with reference to FIG. 3.

Figure 3:
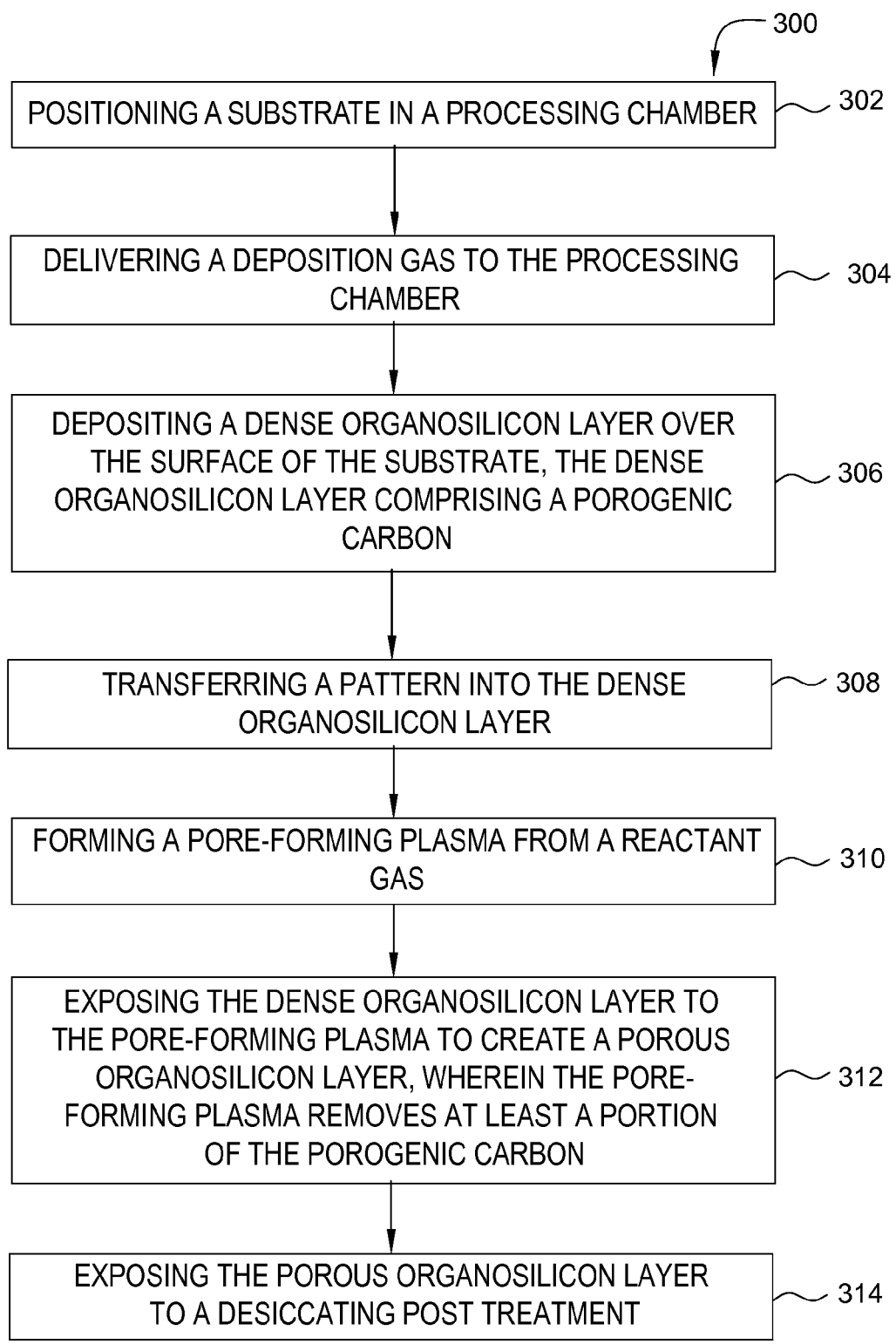
FIG. 3 is a flow diagram of a method for forming a porous organosilicon layer according to one or more embodiments.

FIG. 3 is a flow diagram of a method 300 for depositing a dielectric layer according to one embodiment. The method 300 begins with positioning a substrate in a processing chamber, as in step 302. The substrate can be a substrate as described with reference to FIG. 2A. Suitable substrate materials can include but are not limited to glass, quartz, sapphire, germanium, plastic or composites thereof. Additionally, the substrate can be a relatively rigid substrate or a flexible substrate. Further, any suitable substrate size may be processed. Examples of suitable substrate sizes include substrate having a surface area of about 2000 centimeter square or more, such as about 4000 centimeter square or more, for example about 10000 centimeter square or more.

A deposition gas is then delivered to the processing chamber, as in step 304. One or more deposition gases may be used to deposit the dielectric layer. In one embodiment, the deposition gas can comprise one or more precursors selected from the group consisting of diethoxymethylsilane, dimethoxymethylsilane, di-isopropoxymethylsilane, di-t-butoxymethylsilane, methyltriethoxysilane, methyltrimethoxysilane, methyltri-isopropoxysilane, methyltri-t-butoxysilane, dimethyldimethoxysilane, dimethyldiethoxysilane, dimethyldi-isopropoxysilane, dimethyldi-t-butoxysilane, and tetraethoxysilane, trimethylsilane, tetramethyl-silane, methyltriacetoxysilane, methyldiacetoxysilane, methylethoxydisiloxane, tetramethylcyclotetrasiloxane, octamethylcyclo-tetrasiloxane, dimethyldiacetoxy-silane, bis(trimethoxysilyl)methane, bis(dimethoxysilyl)methane, tetraethoxy-silane, triethoxysilane, and mixtures thereof. In another embodiment, the deposition gas includes diethoxymethylsilane and bicycloheptadiene.

A dense organosilicon layer is deposited over the surface of the substrate, as in step 306. The dielectric layer can be deposited using the deposition gas by known techniques, such as CVD, PECVD, MW-PECVD, hotwire CVD or others. The dense organosilicon layer can comprise a porogenic carbon. Porogenic carbon is carbon which can be removed from the layer to form pores in the organosilicon layer. The layer can be deposited to a specific thickness such as between 50 Å and 500 Å. As described above, the organosilicon layer can be composed of silicon, carbon, oxygen and hydrogen in various proportions.

Then a pattern can be transferred into the dense organosilicon layer, as in step 308. Transferring the pattern, as used herein, can include any known method or technique of forming a feature in a dielectric layer. In one embodiment, transferring the pattern comprises forming a hardmask, forming a photoresist, exposing the photoresist, etching the hardmask, and etching the organosilicon layer.

A pore-forming plasma is then formed from a reactant gas, as in step 310. The reactant gas can be either an oxidative gas or a reductive gas. In one embodiment, the reactant gas is an oxidative gas selected from the group ozone ($O_3$), $H_2O$, oxygen ($O_2$) or combinations thereof. In another embodiment, the reactant gas is a reductive gas comprising hydrogen ($H_2$), ammonia ($NH_3$), methane ($CH_4$) or other carbon-containing gases, or combinations thereof. The pore forming-plasma can be formed using one or more power sources known in the art, such as RF power or microwave power. Further, the pore forming plasma may be formed in the chamber or remotely.

The dense organosilicon layer is then exposed to the pore-forming plasma to create a porous organosilicon layer, as in step 312. The pore-forming plasma can remove at least a portion of the porogenic carbon. In one example, the pore-forming plasma reacts with and removes all available porogenic carbon.

Finally, the porous organosilicon layer can be exposed to a desiccating post treatment, as in step 314. A desiccating post treatment can be a treatment for reducing moisture and ⁻OH groups in the porous organosilicon layer. In one or more embodiments, this can include thermal processing, UV processing or e-beam processing. When thermal processing is used, the porous organosilicon layer can be heated to a temperature which is less than a critical temperature for the porous organosilicon layer and maintains minimal shrinkage of the layer. When UV processing is used, the porous organosilicon layer can be exposed to UV energy such that shrinkage is maintained less than 15% of the overall layer thickness, such as less than 10% of the overall layer thickness.

It is believed that shrinkage during pore formation can be deleterious to the organosilicon layer with one or more features formed therein. UV and e-beam pore formation are believed to create unacceptable levels of shrinkage as they react the porogenic carbon to create the pores. Thus, when generating the pores, care should be taken so as to mitigate shrinkage of the organosilicon layer. The pore-forming plasma described above has limited shrinkage. Using a thermal cure with the pore-forming plasma can maintain a low shrinkage, such as a shrinkage of less than 5 percent. Thus the pore-forming plasma with a limited shrinkage desiccating post treatment, such as thermal treatment, can prevent damage to the organosilicon layer and allows for advanced nodes of less than 20 nm.

In a first set of embodiments, the organosilicon layer with the porogenic carbon was deposited by PECVD with a post treatment using ozone and thermal energy. The ozone was used to remove the porogenic carbon. The thermal energy reduced the k value by reducing moisture and ⁻OH groups.

In one exemplary embodiment, an organosilicon layer was deposited on a substrate by PECVD. The organosilicon layer was not treated with plasma or cured prior to testing, thus serving as a control. In this example, the thickness was 2461 Å. The refractive index was 1.4230. Shrinkage of the layer was 0%. The average k value of the layer was 3.10. The ratio of CH/SiO bonds was 0.062.

In another embodiment, an organosilicon layer was deposited on a substrate by PECVD. The organosilicon layer was treated with an ozone plasma for 5 seconds prior to thermal curing. In this example, the thickness was 2400 Å. The refractive index was 1.407. Shrinkage of the layer was 2.6%. The average k value of the layer was 3.1. The ratio of CH/SiO bonds was 0.051.

In another embodiment, an organosilicon layer was deposited on a substrate by PECVD. The organosilicon layer was treated with an ozone plasma for 15 seconds prior to thermal curing. In this example, the thickness was 2325 Å. The refractive index was 1.379. Shrinkage of the layer was 5.0%. The average k value of the layer was 3.20. The ratio of CH/SiO bonds was 0.033.

In a second set of embodiments, the organosilicon layer with the porogenic carbon was deposited by PECVD with a post treatment using ozone and UV energy. The ozone was used to remove the porogenic carbon. The UV provided subsequent crosslinking of the layer and reduced the k value.

In one exemplary embodiment, an organosilicon layer was deposited on a substrate by PECVD. The organosilicon layer was not cured prior to testing, thus serving as a control. In this example, the thickness was 2536 Å. The refractive index was 1.4328. Shrinkage of the layer was 0%. The average k value of the layer was 2.90. The ratio of CH/SiO bonds was 0.087.

In another embodiment, an organosilicon layer was deposited on a substrate by PECVD. The organosilicon layer was treated with an ozone plasma for 10 seconds prior to UV curing. In this example, the thickness was 2287 Å. The refractive index was 1.3405. Shrinkage of the layer was 9.0%. The average k value of the layer was 2.45. The ratio of CH/SiO bonds was 0.031.

In another embodiment, an organosilicon layer was deposited on a substrate by PECVD. The organosilicon layer was treated with an ozone plasma for 20 seconds prior to UV curing. In this example, the thickness was 2183 Å. The refractive index was 1.2859. Shrinkage of the layer was 13.0%. The average k value of the layer was 2.37. The ratio of CH/SiO bonds was 0.009.

The embodiments of the invention described herein generally relate to the formation of a porous organosilicon layer with one or more features. Current methods of integrating a porous dielectric layers form the pores/cure prior to formation of the features. This creates unnecessary damage in the porous dielectric layer. By forming the features in the dense dielectric layer prior to forming the pores or curing, the damage from related processing can be reduced.

While the foregoing is directed to embodiments of the present invention, other and further embodiments of the invention may be devised without departing from the basic scope thereof, and the scope thereof is determined by the claims that follow.

The invention claimed is:

1. A method of forming a dielectric layer comprising:
positioning a substrate in a processing chamber;
delivering a deposition gas to the processing chamber;
depositing a dense organosilicon layer using the deposition gas on the surface of the substrate, the dense organosilicon layer comprising a porogenic carbon;
transferring a pattern into the dense organosilicon layer;
forming a pore-forming plasma from a reactant gas;
exposing the dense organosilicon layer to the pore-forming plasma to create a porous organosilicon layer, wherein the pore-forming plasma removes at least a portion of the porogenic carbon; and
exposing the porous organosilicon layer to a desiccating post treatment.

2. The method of claim 1, wherein the reactant gas comprises an oxidative gas selected from the group comprising $O_3$, $H_2O$, $O_2$ or combinations thereof.

3. The method of claim 1, wherein the reactant gas comprises a reductive gas selected from the group consisting of $H_2$, $NH_3$, $CH_4$, a carbon-containing gas or combinations thereof.

4. The method of claim 1, wherein the dense organosilicon layer comprises silicon, oxygen and carbon.

5. The method of claim 1, wherein the deposition gas comprises diethoxymethylsilane.

6. The method of claim 1, wherein the dense organosilicon layer is deposited using PECVD.

7. The method of claim 1, wherein the desiccating post treatment comprises heating the porous organosilicon layer.

8. The method of claim 1, wherein the desiccating post treatment comprises exposing the porous organosilicon layer to UV energy.

9. A method of forming a dielectric layer comprising:
activating a deposition gas in the presence of a substrate to deposit an organosilicon layer on a surface of the substrate, the organosilicon layer comprising a porogenic carbon;
transferring a pattern into the organosilicon layer;
removing the porogenic carbon from the organosilicon layer to create a porous organosilicon layer; and
exposing the porous organosilicon layer to a desiccating post treatment.

10. The method of claim 9, wherein removing the porogenic carbon comprises delivering an oxidative gas to the organosilicon layer.

11. The method of claim 9, wherein removing the porogenic carbon comprises delivering a reductive gas to the organosilicon layer.

12. The method of claim 9, wherein the organosilicon layer comprises silicon, oxygen and carbon.

13. The method of claim 9, wherein the deposition gas comprises diethoxymethylsilane.

14. The method of claim 9, wherein the desiccating post treatment comprises exposing the porous organosilicon layer to UV energy.

15. A method of forming a dielectric layer comprising:
    positioning a substrate in a processing chamber;
activating a deposition gas in the presence of a substrate to deposit an organosilicon layer on a surface of the substrate, the organosilicon layer comprising silicon, oxygen, carbon, hydrogen and a porogenic carbon;
transferring a pattern into the organosilicon layer;
forming a pore-forming plasma from a reactant gas, the pore forming plasma comprising an oxidative gas;
    exposing the organosilicon layer to the pore-forming plasma to create a porous organosilicon layer; and
    exposing the porous organosilicon layer to a desiccating post treatment, the desiccating post treatment selected from UV treatment, thermal treatment or e-beam treatment.

16. The method of claim 1, wherein the reactant gas comprises an oxidative gas.

17. The method of claim 1, wherein the reactant gas comprises a reductive gas.

18. The method of claim 10, wherein the oxidative gas is selected from the group consisting of $O_3$, $H_2O$, $O_2$, or combinations thereof.

19. The method of claim 14, wherein the reductive gas is selected from the group consisting of $H_2$, $NH_3$, $CH_4$, a carbon-containing gas, or combinations thereof.

20. The method of claim 9, wherein the desiccating post treatment comprises heating the porous organosilicon layer.

* * * * *